United States Patent [19]

Bailly

[11] Patent Number: 5,631,605
[45] Date of Patent: May 20, 1997

[54] POWER AMPLIFIER STAGE SUPPLYING A RECTANGULAR SIGNAL OF CONTROLLED AMPLITUDE

[75] Inventor: Patrick Bailly, Caen, France

[73] Assignee: U.S. Philips Corporation, New York, N.Y.

[21] Appl. No.: 544,504

[22] Filed: Oct. 18, 1995

[30] Foreign Application Priority Data

Oct. 19, 1994 [FR] France .................................. 94 12489

[51] Int. Cl.$^6$ ............................................. H03F 3/217
[52] U.S. Cl. .................................. 330/146; 330/251
[58] Field of Search .......................... 330/51, 146, 252, 330/254, 261, 251

[56] References Cited

U.S. PATENT DOCUMENTS

| | | | |
|---|---|---|---|
| 4,638,260 | 1/1987 | Hamley | 330/254 |
| 5,126,884 | 6/1992 | Solomon | 330/251 X |
| 5,382,915 | 1/1995 | Muri et al. | 330/251 X |
| 5,453,717 | 9/1995 | Gerfault | 330/146 |

FOREIGN PATENT DOCUMENTS

| | | | |
|---|---|---|---|
| 0587945 | 3/1994 | European Pat. Off. | |
| 0581568 | 11/1977 | U.S.S.R. | 330/124 |

*Primary Examiner*—Steven Mottola
*Attorney, Agent, or Firm*—Michael E. Marion

[57] ABSTRACT

A power amplifier stage for producing a rectangular signal across a load, which may be predominantly capacitive, by means of a "bridge" amplifier comprises a first pair of transistors which operate alternately as an emitter follower and a second pair of transistors which alternately closes the circuit of the load. The four transistors of the bridge amplifier are respectively driven by identical four current sources in order to minimize the impedance of the circuit of the load for direct current. The transistors of the second pair are alternately connected as diodes. To control the signal amplitude, a generator supplies a control voltage whose value corresponds to a fixed component equal to $2.V_{BE}$, plus a variable component corresponding to the desired amplitude of the signal. Such a power amplifier stage can be used for driving a piezo-electric transducer, particularly for a telephone bell.

3 Claims, 2 Drawing Sheets

POWER AMPLIFIER STAGE SUPPLYING A RECTANGULAR SIGNAL OF CONTROLLED AMPLITUDE

BACKGROUND OF THE INVENTION

1. Field of the Invention

The invention relates to a power amplifier stage producing a rectangular signal across a load by means of a "bridge" type amplifier comprising two pairs of bipolar transistors of the same conductivity type, a first pair of transistors having their respective emitters connected to the terminals of the load and to the respective collectors of the transistors of a second pair of transistors, a plurality of switching devices alternately supplying an amplitude control voltage to the respective bases of the transistors of the first pair and synchronously changing the base bias of the transistors of the second pair.

2. Discussion of the Related Art

A power stage of the type defined in the opening paragraph is known from the document EP-A-0,587,945. According to said document a rectangular-type signal is generated across a load by means of eight switches, of which four switches are actuated in phase with one another and four are actuated in phase opposition thereto. The amplitude of the signal obtained across the load is regulated by switching a capacitance so as to connect it alternately, by means of two change-over switches, across the load and to the input of a feedback amplifier for comparison with a reference voltage.

The known amplifier stage has been designed to drive a load whose impedance is resistive and, as the case may be, inductive and so as to avoid instability owing to the negative feedback of the amplifier and the parasitic capacitances of the circuit. It is not very suitable for driving a load whose impedance is mainly capacitive, as in the case of a piezoelectric transducer for sound-signal generation. Since no direct current flows through a load of this type the voltage signal obtained by means of the known amplifier stage will be highly distorted with a substantial loss of harmonics of the signal. However, to improve the acoustic efficiency of a transducer of this type it is required to generate upper harmonics, particularly in the case of ringing signals as, for example, in a telephone set.

Moreover, the amplifier stage known from the document cited proves to be comparatively complicated, particularly with respect to the large number of switches used for generating the rectangular pulse signal across the load.

SUMMARY OF THE INVENTION

It is an object of the invention to provide a power amplifier stage which is of simple construction and hence economically integratable and which is adapted top drive a predominantly capacitive load such as a piezoelectric transducer. It is an further object of the invention to provide a power amplifier stage capable of performing a call bell function amongst other functions realised by an integrated circuit intended for use in telephone receivers, the sound of said call bell being adjustable to any level desired by the user, including a low level, without a change of the tonal quality of the call bell.

The invention is based, in particular, on the idea that a rectangular switching signal will be applied correctly to a capacitive load if the voltages applied to the terminals of the load are generated by a source of sufficiently low impedance for direct current.

According to the invention the power amplifier stage of the type defined in the opening paragraph is therefore characterised in that the bases of the four transistors of the amplifier are respectively coupled to four current sources supplying substantially equal currents and in that the transistors of the second pair are alternately connected as diodes by means of two of the switching devices.

The invention requires the use of only four switching devices for driving the bridge amplifier instead of the eight switches used in the prior-art amplifier stage for merely driving the bridge amplifier.

Since a permanent base current is sustained in each of the four transistors of the amplifier the terminals of the load receive at any instant a voltage generated with an impedance whose maximum value for direct current is fixed. This value can readily be adapted to the nominal capacitance of a given load, for example by an appropriate choice of the current supplied by the base current sources, which current ensures a fixed rise time of the signal.

The amplifier stage in accordance with the invention avoids the use of negative feedback and the instability problems associated therewith when the load is predominantly capacitive. Yet, this amplifier stage enables the output signal voltage to be switched rapidly and assures an accurate control of the amplitude of this signal even at low levels of the order of $1/10$ V peak.

The operating characteristics of the power amplifier stage in accordance with the invention can be made substantially independent of fluctuations of the gain of the transistors (variations as a result of the fabrication process) and temperature variations in an embodiment of the invention which is characterised in that the current sources driving the bases are formed by means of a current mirror having four outputs which are paired with one another and having an input receiving the base current of a fifth transistor of the same conductivity type as the four first transistors, the emitter of said fifth transistor being driven by a reference current source. Thus, the four base currents are compared with the base current of the fifth transistor whose emitter current is fixed by a stable reference source. The emitter currents of the four transistors forming the bridge amplifier are thus made substantially identical to the current of the fifth transistor or to a multiple of this current depending on whether the current mirror has an output-to-input-current ratio equal to or larger than unity.

In uses where the load produces a sound signal, such as a telephone bell, for which it is desirable that the sound volume can be adjusted in a wide range of values, it is advantageous in accordance with the invention if the amplitude control voltage is obtained from a voltage generator comprising a digital-to-analog converter for the conversion of digital control signals applied to the input of this generator.

BRIEF DESCRIPTION OF THE DRAWINGS

The nature of the invention and how it can be implemented will be more fully understood with the aid of the following description with reference to the accompanying drawings, given by way of non-limitative examples.

DETAILED DESCRIPTION OF THE PREFERRED EMBODIMENTS

Figure 1:
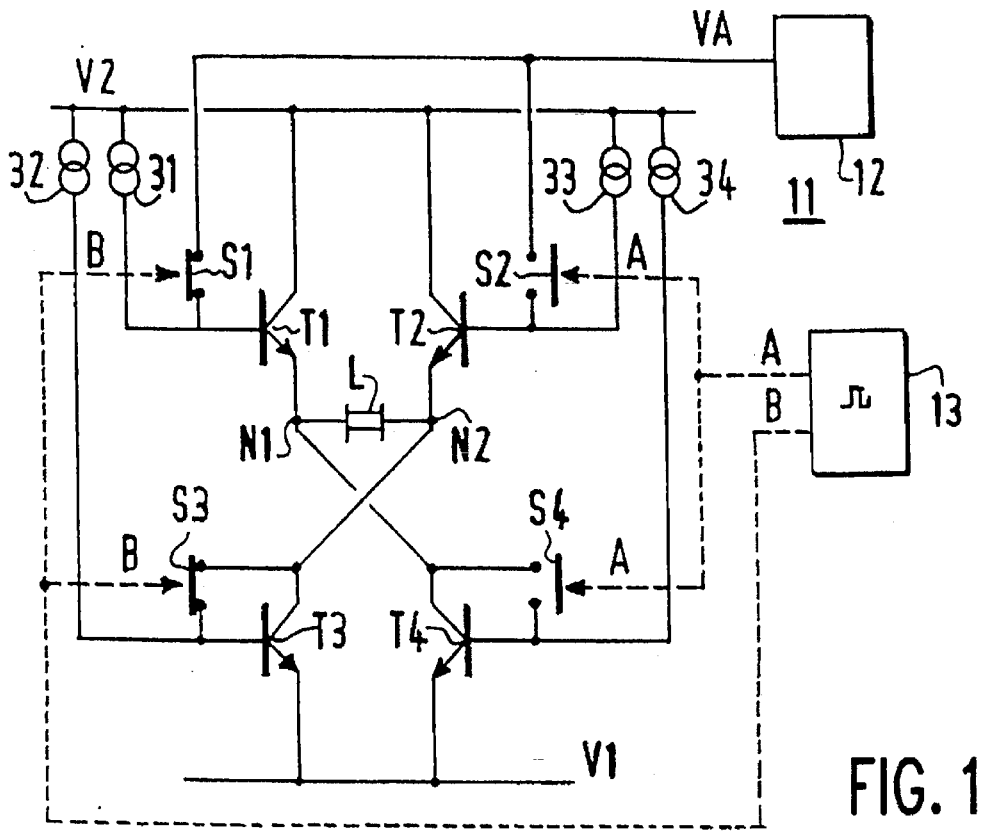
FIG. 1 shows the circuit diagram of a power amplifier stage in accordance with the invention.

FIG. 1 shows a power amplifier stage in accordance with the invention. It comprises a "bridge" type amplifier with two pairs of bipolar NPN-type transistors, i.e. a first pair of transistors T1, T2 having their respective emitters connected to the terminals of a load L and to the collectors of a second pair of transistors T3, T4 whose emitters are coupled to a supply terminal V1, which serves as a voltage reference. The collectors of the two transistors T1, T2 of the first pair are connected to a positive supply voltage V2. A voltage generator 12 supplies a control voltage VA which is adjustable and is applied alternately to the bases of the transistors T1 and T2 by means of two switching devices S1 and S2. The transistors T3 and T4 of the second transistor pair are alternately connected as diodes by means of two switching devices S3, S4. The switching devices S1 to S4 are controlled by a switching signal generator 13, which determines the frequency and the duty cycle of the rectangular signals to be supplied to the load L. The generator is configured in such a manner that the switching devices S1 and S3 are closed simultaneously while the switching devices S2 and S4 are actuated in phase opposition. The switching devices may be formed by MOS-type field effect transistors.

The four transistors T1–T4 of the bridge amplifier have their bases connected to four current sources 31–34, respectively, which current sources supply substantially identical currents derived from the supply voltage V2. This arrangement is very suitable for driving a load L having a substantially capacitive impedance, as in the case of a piezoelectric transducer.

The figure shows the switching devices in states corresponding to one of the two possible states of a rectangular signal.

In this situation the generator 13 supplies a signal A, which controls the opening of the switching devices S2 and S4, and a signal B, which is the inverse of the signal A and which controls the closure of the switching devices S1 and S3. The amplitude control voltage VA is applied to the base of the transistor T1, which operates as an emitter-follower and which supplies this voltage minus one base-emitter voltage drop to a terminal N1 of the load L. The transistor T4, whose collector is connected to the same terminal N1 of the load L, draws a current equal to β times the current supplied by the base current source 34 (β being the value of the current gain of the transistors).

This current drawn by the emitter of the transistor imposes a limit on the value of the base-emitter voltage drop ($V_{BE}$) of the transistor T1 outside the transition period corresponding to the change-over of the signal. In the absence of such a current the value of $V_{BE}$ will continue to decrease at an increasingly lower rate as time lapses.

The diode-connected transistor T3 forms a low impedance for the transmission of transient currents from the terminal N2 of the load L to the supply line V1, an upper limit being imposed on this impedance by the emitter current of the transistor T2, which current is equal to (β+1) times the current of the current source 33 applied to the base of this transistor.

It is obvious that for the other half-cycle of the signal the switching devices will be opened and closed in a pattern opposite to that just described.

At the instant of the transition from one half-cycle to the other for the signal applied to the load L a substantial transient current will flow through this load because the capacitance of the load was biased in a manner inverse to that just before the transition.

During the transient period which then occurs it can be found that the base-emitter voltage of the transistor of the first pair operating as an emitter-follower decreases as time lapses because the current through the load L also decreases. In the transistor, which closes the circuit at this instant since it is connected as a diode, the voltage drop decreases as time elapses because the current flowing through this diode decreases. The limit values of these two $V_{BE}$s are dictated by the direct current supplied by the transistors under the influence of the base current sources 31 to 34. The rise times of the amplitude levels of the rectangular signal to be generated at the load L can thus be set to the desired value by selecting the value of the direct current supplied by the transistors.

Figure 2:
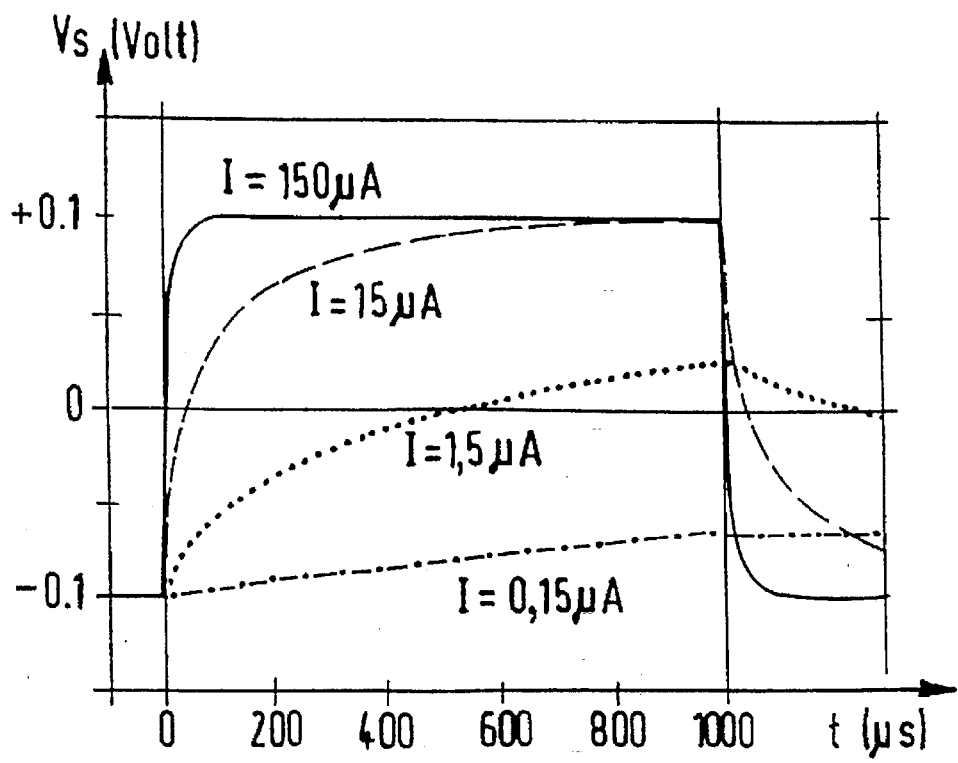
FIG. 2 gives waveforms of output signals of the circuit shown in FIG. 1 for different d.c. bias values of the transistors.
Figure 3:
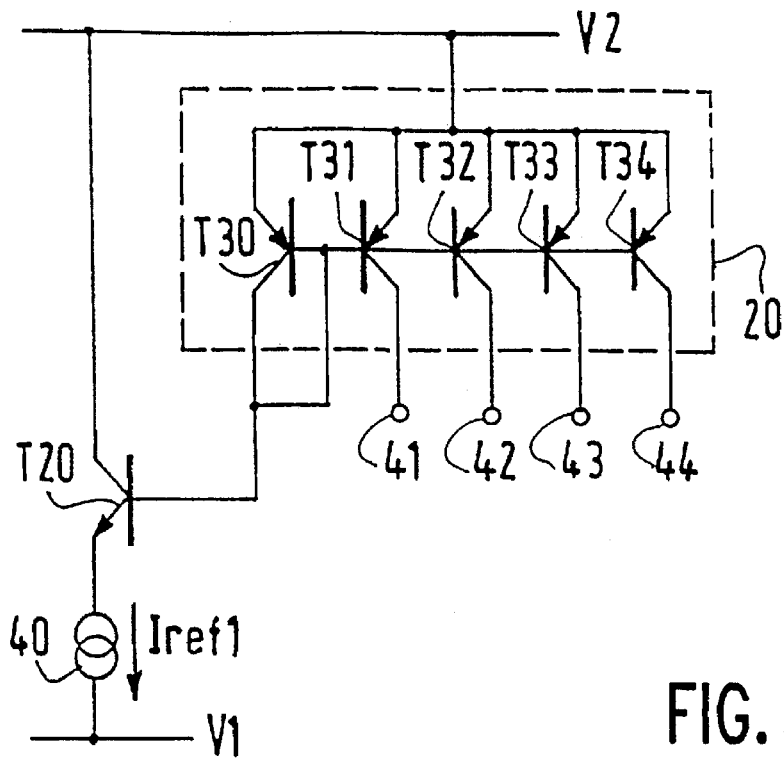
FIG. 3 shows the diagram of a preferred design of a base current generator having four outputs for use in the amplifier stage in accordance with the invention.

FIG. 2 gives the waveforms of the output signals of the amplifier stage shown in FIG. 3 for different values of the direct current flowing through the transistors T1 to T4 during the time t. The load L has a capacitance of 80 nF.

FIG. 2 shows the voltage Vs across the load L for a peak voltage of 0.1 V. The shown parameter I is the value of the direct current applied to the transistors T1–T4, i.e. β times the current of the current sources 31–34.

It is evident that for an amplitude as low as 0.1 V the resulting signal waveform can vary substantially as function of the selected current I and more closely resembles a rectangular signal as the current I increases. A current value of the order of 150 µA is found to be adequate and very suitable for generating a sound signal by means of a transducer of this type.

FIG. 3 shows the circuit diagram of a base current generator which is particularly suitable for constructing the current sources 31 to 34 in FIG. 1. This generator comprises a current mirror 20 formed by five transistors of the PNP type, one input transistor T30 and four output transistors T31 to T34. The transistors T31 to 34 are paired in such a manner that the currents supplied by their respective collectors 41 to 44 are equal to one another. Another method of obtaining reproducible results as a function of possible variations in the fabrication process and as a function of variations of the operating temperature is to supply the input transistor T30 of the current mirror 20 with the base current of an NPN transistor T20 whose emitter receives a reference current Iref1 supplied by a reference current source 40. The reference current Iref1 can be rendered temperature independent by means known to those skilled in the art. If in the process of realising the amplifier stage in accordance with the invention variations in gain of the NPN transistors occur the current supplied by the transistors T1 to T4 of the bridge amplifier will nevertheless be controlled so as to be equal to the current supplied by the transistor T20. It is also possible to give the current mirror 20 an input/output current ratio which differs from unity, and particularly an output current larger than the input current. A reduction of the current consumption is thus obtained by reducing the current supplied by the transistor T20. In this case the currents supplied by the transistors T31 and T34 will be proportional to the base current of T20 and the emitter/collector currents of the transistors T1 to T4 themselves will be proportional to the reference current Iref1.

As regards the amplitude of the signal produced at the load L it is evident that this amplitude is related to the voltage VA supplied by the voltage generator 12 (FIG. 1) minus two voltage drops across a forward biased diode. It is therefore advantageous if the amplitude control voltage generator supplies a voltage VA having a fixed component equal to 2. $V_{BE}$ and a component which varies as desired. When the load L is a piezo-electric transducer for the generation of a sound signal it is desirable that the variation of this variable component of the control voltage proceeds more rapidly than a linear variation, in such a manner that it approximates the sensitivity of the human ear and that the variable component varies, for example, in accordance with a geometric progression.

Figure 4:
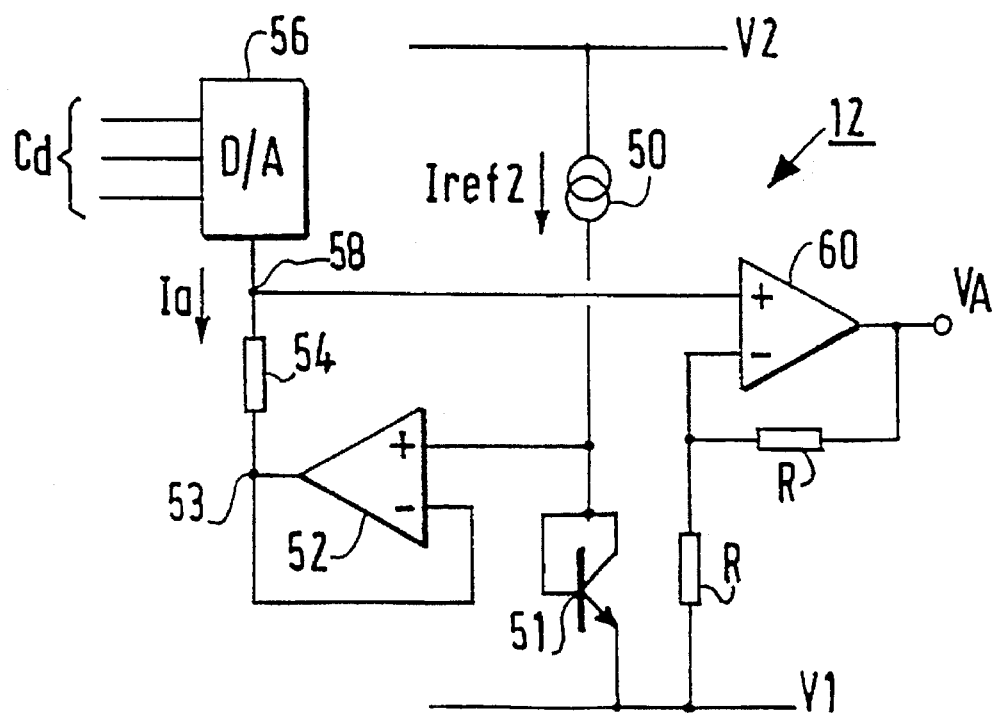
FIG. 4 gives the diagram of an amplitude control voltage generator adapted to control the amplifier stage shown in FIG. 1.

FIG. 4 shows the diagram of an example of an amplitude control voltage generator. The generator 12 comprises a reference current source 50 which feeds a reference current Iref2, derived from the positive supply voltage V2, into a diode-connected transistor 51 having its emitter coupled to the reference supply voltage V1. The voltage drop across the diode 51 under the influence of the current Iref2 is applied to the input of a unity-gain amplifier 52 whose output 53 is at a voltage equal to the input voltage but at a lower impedance.

The generator 12 further comprises a digital-to-analog converter 56 for the conversion of digital input signals Cd into an analog current Ia, which is applied to one end of a resistor 54, whose other end is connected to the output 53 of the amplifier 52.

If, for example, the input signals Cd are supplied in a 3-bit format the converter 56 may be adapted to supply a succession of eight current values Ia ranging between 1 μA and 128 μA, successive values differing by a factor of 2. The end 58 of the resistor 54 therefore carries a voltage which, for one part, is proportional to the current Ia representing the variable component of the control voltage, plus a part which represents the voltage drop across the diode 51. This end 58 is coupled to the input of another amplifier 60 whose voltage gain is set to 2 through negative feedback via two equal resistors referenced R in FIG. 3. At its output, this amplifier 60 supplies a voltage VA to be used for controlling the amplitude of the signal supplied by the bridge amplifier.

The control signal VA consequently has a fixed component corresponding to twice the voltage drop in the transistor 51, thus enabling an amplitude equal to the variable component of the control signal VA to be obtained across the load L.

An exact $V_{BE}$ compensation is obtained if the current Iref2 of the current source 50 has a suitable relationship with the current Iref1 of the current source 40 shown in FIG. 3, taking into account the ratios of the areas of the transistors used both in the current mirror 20 (FIG. 3) and in the bridge amplifier shown in FIG. 1.

I claim:

1. A power amplifier stage for producing a rectangular signal across a load by means of a "bridge" type amplifier, said power amplifier stage comprising two pairs of bipolar transistors of the same conductivity type, a first pair of transistors having their respective emitters connected to the terminals of the load and to the respective collectors of the transistors of a second pair of transistors, a plurality of switching devices alternately supplying an amplitude control voltage to the respective bases of the transistors of the first pair and synchronously changing the base bias of the transistors of the second pair, wherein the bases of the four transistors of the amplifier are respectively coupled to four current sources for supplying substantially equal currents and further wherein the transistors of the second pair are alternately connected as diodes by means of two of the switching devices.

2. The power amplifier stage as claimed in claim 1, wherein the current sources driving the bases are formed by means of a current mirror having four outputs which are paired with one another and having an input receiving the base current of a fifth transistor of the same conductivity type as the transistors of the first and second pair, the emitter of said fifth transistor being driven by a reference current source.

3. The power amplifier stage as claimed in claim 2, wherein the amplitude control voltage is obtained from a voltage generator comprising a digital-to-analog converter for the conversion of digital control signals applied to the input of the voltage generator.

* * * * *